US012794477B2

(12) United States Patent
Liu

(10) Patent No.: US 12,794,477 B2
(45) Date of Patent: Nov. 10, 2026

(54) POWER SWITCH DEVICE, LAYOUT METHOD, AND SYSTEM

(71) Applicant: TAIWAN SEMICONDUCTOR MANUFACTURING COMPANY, LTD., Hsinchu (TW)

(72) Inventor: Jack Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 101 days.

(21) Appl. No.: 18/484,124

(22) Filed: Oct. 10, 2023

(65) Prior Publication Data

US 2025/0119143 A1 Apr. 10, 2025

(51) Int. Cl.

*H03K 19/094* (2006.01)
*G06F 30/392* (2020.01)
*H03K 3/037* (2006.01)
*H03K 19/21* (2006.01)

(52) U.S. Cl.

CPC ......... *H03K 19/094* (2013.01); *G06F 30/392* (2020.01); *H03K 3/037* (2013.01); *H03K 19/21* (2013.01)

(58) Field of Classification Search

CPC ....... H03K 19/094; H03K 19/20; H03K 19/21
See application file for complete search history.

(56) References Cited

U.S. PATENT DOCUMENTS

| | | | | |
|---|---|---|---|---|
| 6,107,700 A * | 8/2000 | Ishikawa | G05F 1/465 | 327/544 |
| 6,169,419 B1 * | 1/2001 | De | H03K 19/0016 | 326/50 |
| 7,411,267 B2 * | 8/2008 | Yamawaki | H03K 17/6871 | 257/499 |
| 8,415,977 B1 * | 4/2013 | Oda | H03K 19/17784 | 326/38 |
| 10,950,546 B1 * | 3/2021 | Doornbos | H10D 84/0186 | |
| 11,552,069 B1 * | 1/2023 | Chang | G06F 1/3287 | |
| 2004/0196082 A1 * | 10/2004 | Pacha | H03K 3/356139 | 327/215 |
| 2005/0200382 A1 * | 9/2005 | Drenth | H03K 19/0016 | 326/38 |
| 2005/0276132 A1 * | 12/2005 | Severson | H03K 19/0016 | 365/202 |
| 2006/0114025 A1 * | 6/2006 | Frenkil | G06F 30/3312 | 326/35 |
| 2008/0098342 A1 * | 4/2008 | Yoshimoto | H03K 19/0016 | 716/120 |

(Continued)

FOREIGN PATENT DOCUMENTS

TW 202217806 5/2022

*Primary Examiner* — Jason M Crawford
(74) *Attorney, Agent, or Firm* — Hauptman Ham, LLP

(57) ABSTRACT

An IC device includes a first interconnect structure configured to distribute a power supply voltage, a second interconnect structure configured to distribute a reference voltage, a third interconnect structure configured to distribute a first power gating signal, and a plurality of logic circuits. Each logic circuit of the plurality of logic circuits includes a power switch coupled in series with a logic gate between the first and second interconnect structures, and the power switch includes a control terminal coupled to the third interconnect structure.

20 Claims, 10 Drawing Sheets

(56) References Cited

U.S. PATENT DOCUMENTS

| | | | | |
|---|---|---|---|---|
| 2009/0045677 | A1* | 2/2009 | Frey | H03K 17/30 307/38 |
| 2010/0066406 | A1* | 3/2010 | Noda | H03K 19/00361 326/33 |
| 2010/0171523 | A1* | 7/2010 | Yamashita | H03K 19/01 326/38 |
| 2011/0193618 | A1 | 8/2011 | Ogata | |
| 2012/0249226 | A1* | 10/2012 | Ishii | G11C 11/4074 327/534 |
| 2013/0200945 | A1 | 8/2013 | Siquenza et al. | |
| 2018/0254778 | A1* | 9/2018 | Rios | G06F 1/3203 |
| 2020/0019671 | A1* | 1/2020 | Lin | G06F 30/398 |
| 2020/0135929 | A1* | 4/2020 | Van Dal | B82Y 10/00 |
| 2021/0098361 | A1* | 4/2021 | Doornbos | H10D 30/67 |
| 2021/0272903 | A1* | 9/2021 | Doornbos | H10D 84/0186 |
| 2022/0181491 | A1* | 6/2022 | Van Dal | B82Y 10/00 |
| 2022/0293634 | A1* | 9/2022 | Okamoto | H10D 84/907 |
| 2023/0260906 | A1* | 8/2023 | Lo | H10D 84/83 257/211 |
| 2023/0260910 | A1* | 8/2023 | Doornbos | H10D 84/0186 257/206 |
| 2023/0385518 | A1* | 11/2023 | Lin | G03F 1/36 |
| 2025/0119143 | A1* | 4/2025 | Liu | G06F 30/392 |
| 2025/0275253 | A1* | 8/2025 | Chang | H10D 89/10 |
| 2026/0128735 | A1* | 5/2026 | Hamada | H03K 5/134 |

* cited by examiner

POWER SWITCH DEVICE, LAYOUT METHOD, AND SYSTEM

BACKGROUND

The ongoing trend in miniaturizing integrated circuits (ICs) has resulted in progressively smaller devices which consume less power, yet provide more functionality at higher speeds than earlier technologies. Miniaturization has been achieved through design and manufacturing innovations tied to increasingly strict specifications. Various electronic design automation (EDA) tools are used to generate, revise, and verify designs for semiconductor devices while ensuring that design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
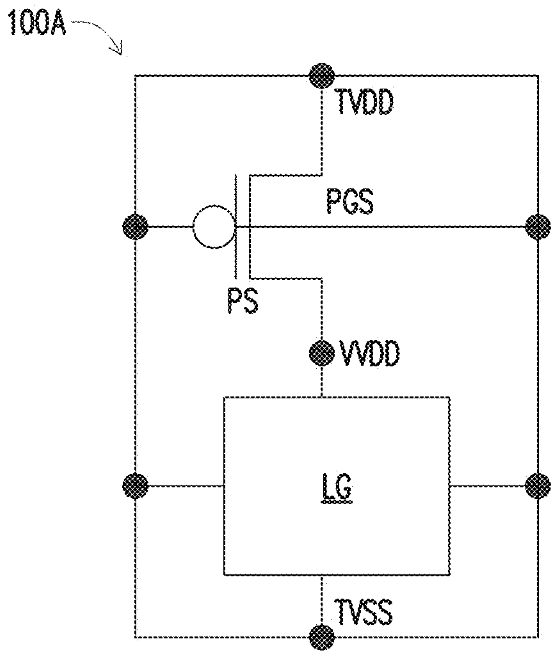
FIGS. 1A-1C are diagrams of an IC layout diagram and corresponding IC device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an integrated circuit (IC) device, layout diagram, and IC design system are directed to logic circuits, corresponding to IC layout cells, that include power switches responsive to power gating signals. Power switches are thereby capable of being distributed throughout IC circuits as needed to address localized IR drop issues related to electromigration and circuit timing.

In some embodiments, IC floorplans are arranged to include logic cells/circuits with embedded power switches, thereby improving area density compared to approaches in which cells/circuits with equivalent logic are electrically connected to local networks that are electrically connected to power distribution networks through network-level power switches.

In some applications, electronic design automation (EDA) tools are used to select cells from cell libraries and place the cells into an initial layout to perform routing by which the cells are connected using one or more metal layers and corresponding vias and contacts. EDA tools are further used to test the routing. Depending upon the test results, the selection, placement and routing of the standard and non-standard cells is revised. In at least some embodiments, the overall selection, placement, routing and testing (SPRT) process is iterative. Eventually, the SPRT process iterations converge to a finalized layout.

In some embodiments, a logic cell/circuit with an embedded power switch is used to replace an equivalent logic cell/circuit in response to a design check, e.g., detecting a resistance-based voltage drop above a threshold, thereby improving design efficiency by avoiding adding parallel network-level power switches as part of an engineering change order (ECO) design stage.

As discussed below, FIGS. 1A-6 are diagrams of IC layout diagrams 100A-600 and corresponding IC devices 100A-600, in accordance with some embodiments. Each of FIGS. 1A-6 is simplified for the purpose of illustration. In various embodiments, IC layout diagrams 100A-600 and corresponding IC devices 100A-600 include arrangement details and features in addition to those depicted in FIGS. 1A-6 that are not depicted for the purpose of clarity.

Figure 7:
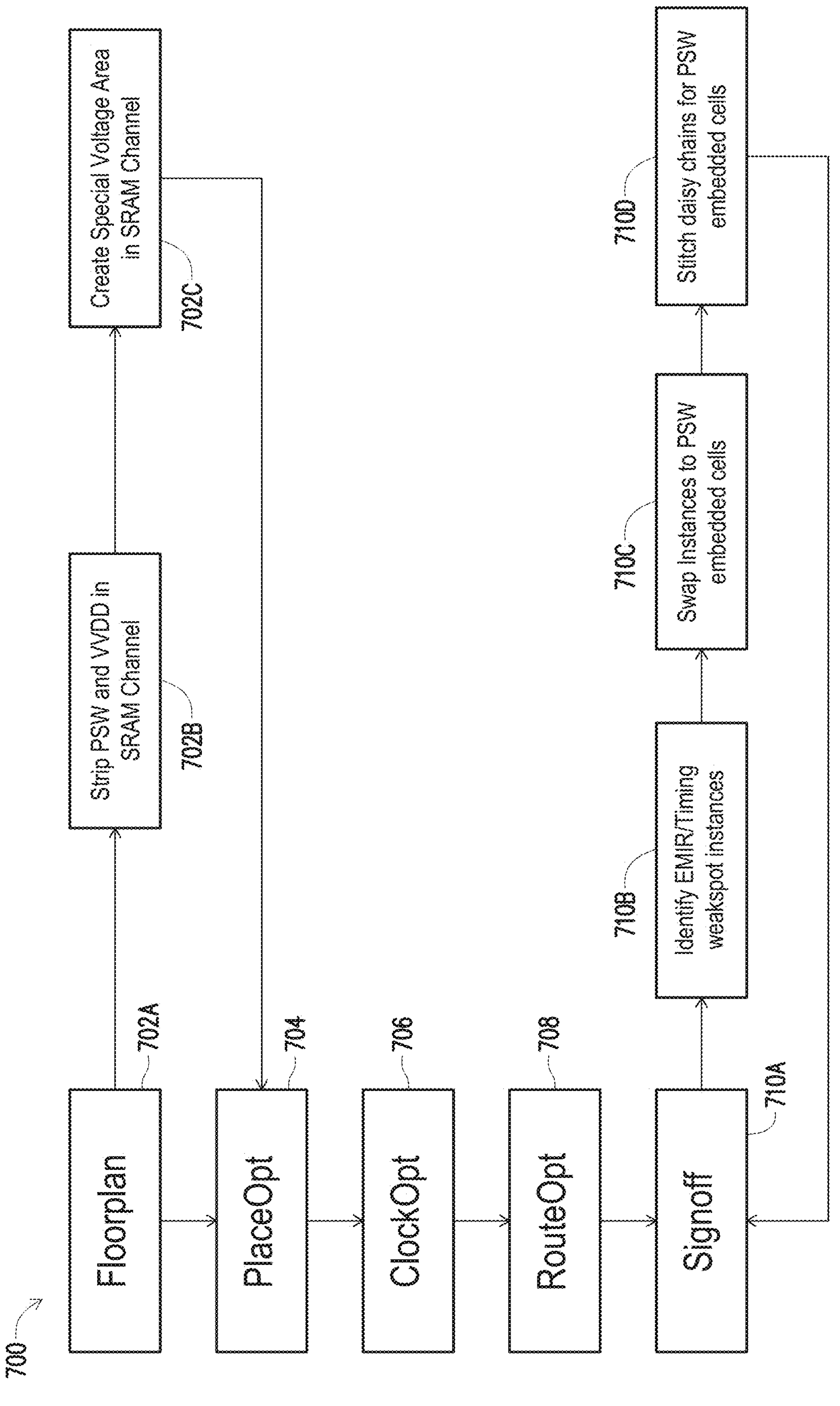
FIG. 7 is a flowchart of a method of generating an IC layout diagram, in accordance with some embodiments.
Figure 8A:
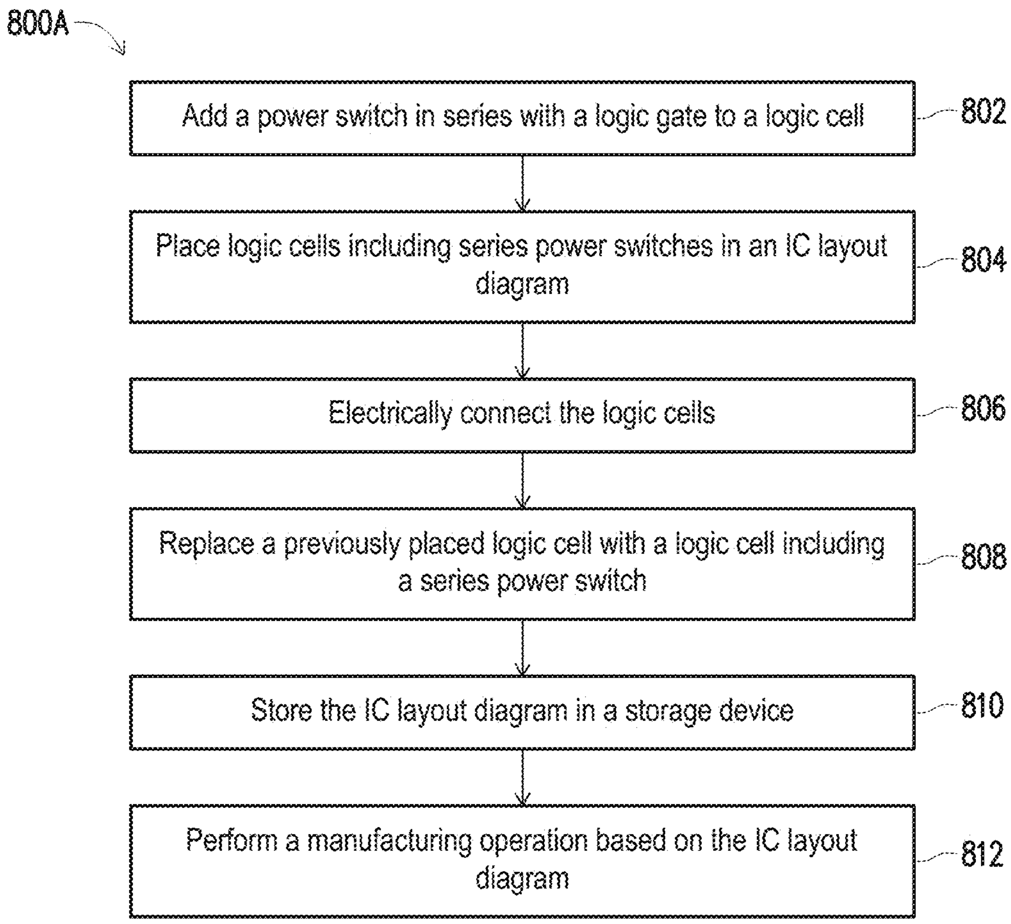
FIGS. 8A and 8B are flowcharts of a method of generating an IC layout diagram, in accordance with some embodiments.
Figure 8B:
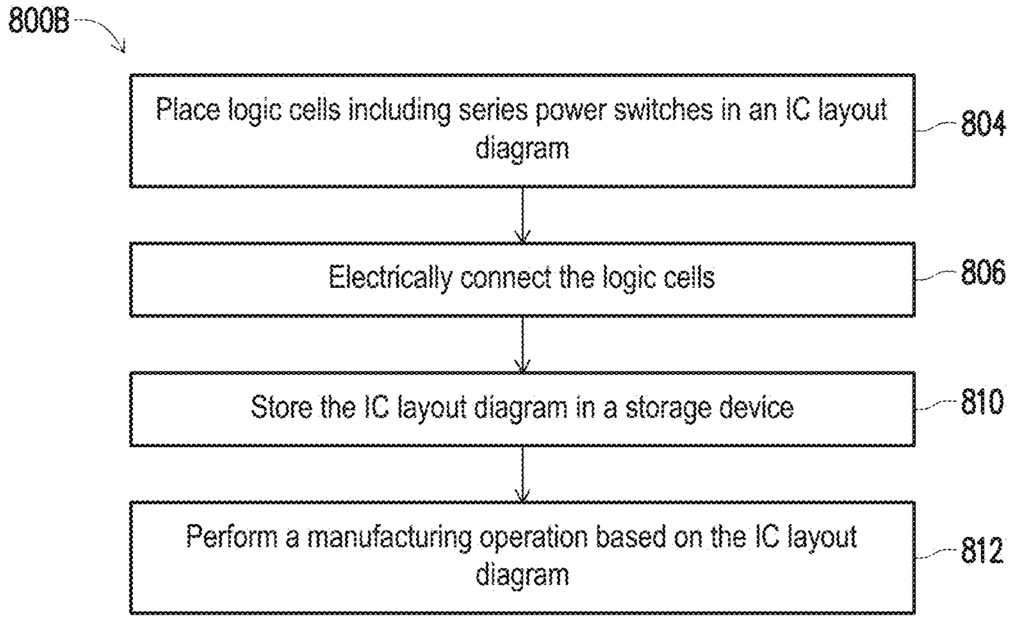
Figure 9:
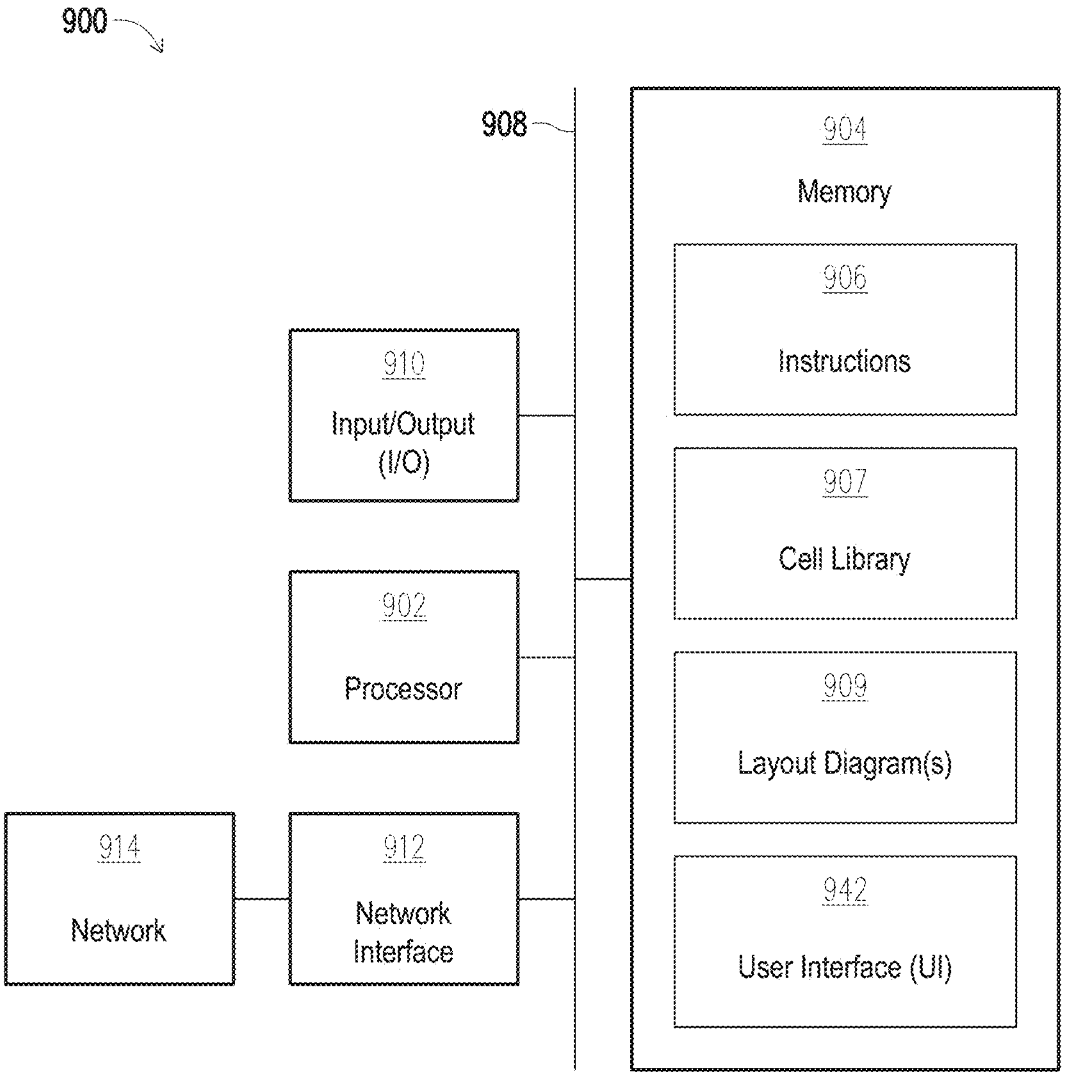
FIG. 9 is a block diagram of an IC design system, in accordance with some embodiments.

The diagrams in FIGS. 1A-6 represent both IC layout diagrams 100A-600 and the corresponding IC devices 100A-600 manufactured based at least in part on IC layout diagrams 100A-600, e.g., in accordance with an IC manufacturing system and associated IC manufacturing flow 1000 discussed below with respect to FIG. 10. In accordance with some embodiments, FIGS. 7, 8A, and 8B are flowcharts of respective methods 700 and 800 of generating an IC layout diagram, e.g., IC layout diagram 100A-600, and FIG. 9 is a block diagram of an IC design system 900, e.g., an EDA system 900, configured to perform some or all of the operations of method 700, method 800A, and/or method 800B.

Figure 1B:
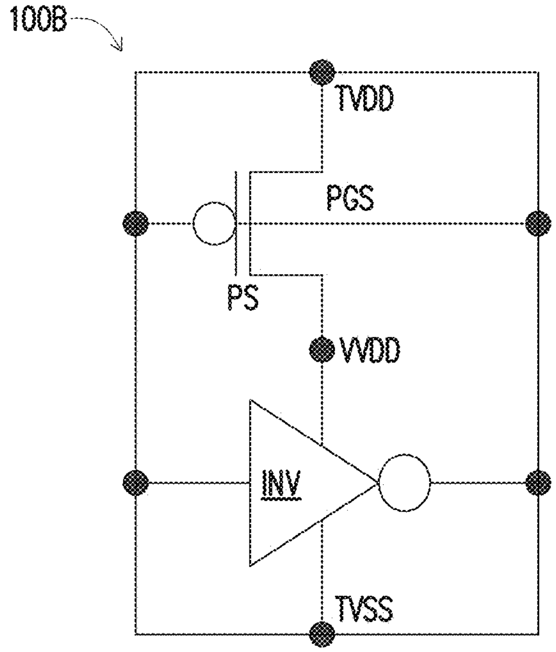
Figure 1C:
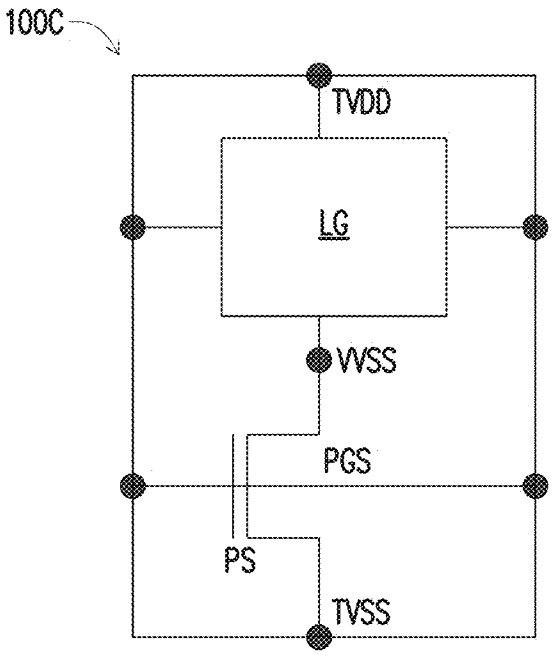

As depicted in FIGS. 1A-1C, each of IC layout diagrams/devices 100A-100C includes a power switch PS configured in a series arrangement with either a logic gate LG or inverter INV, a non-limiting example of logic gate LG. In some embodiments, an IC layout diagram, e.g., an IC layout diagram 100A-100C, is referred to as an IC cell, a cell, a logic cell, an embedded power switch cell or an embedded power switch logic cell. In some embodiments, an IC device, e.g., an IC device 100A-100C, is referred to as a logic device or logic circuit.

The series arrangement includes a first end electrically connected to a power supply voltage TVDD, also referred to as a true power supply voltage TVDD in some embodiments, and a second end electrically connected to a reference voltage TVSS, also referred to as a true reference voltage TVDD, ground TVSS, or true ground TVSS in some embodiments. Power supply voltage TVDD and reference voltage TVSS are further discussed below with respect to FIG. 2.

A logic gate, e.g., logic gate LG, is an IC layout diagram/device, the layout diagram being configured to at least partly define the corresponding logic device arranged to, in operation, perform one or more logic functions. In various embodiments, a logic gate includes one or more of an inverter, a buffer, a transmission gate, an AND gate, a NAND gate, an OR gate, a NOR gate, an XOR gate, a latch, an and-or-inverter (AOI), an or-and-inverter (OAI), a multiplexer, a flip-flop, or the like.

In the various embodiments, a given instance of logic gate LG includes one or more input terminals configured to, in operation, receive corresponding input signals, and one or more output terminals configured to output corresponding output signals. The input/output terminals and signals are not labeled in FIGS. 1A-6 for the purpose of clarity.

In the various embodiments, a given instance of power switch PS includes a control terminal (not labeled) configured to receive a power gating signal, e.g., signal PGS, configured to cause the instance of power switch PS to couple and decouple logic gate LG from the corresponding one of power supply voltage TVDD or reference voltage TVSS, e.g., in accordance with respective power on and power off modes of a corresponding power domain.

As depicted in FIG. 1A, IC layout diagram/device 100A includes power switch PS including a PMOS transistor coupled between power supply voltage TVDD and a node VVDD, and logic gate LG coupled between node VVDD and reference voltage TVSS. In some embodiments, node VVDD is also referred to as a voltage VVDD, a virtual power supply voltage VVDD, or a virtual power supply voltage node VVDD.

Power switch PS of IC layout diagram/device 100A includes the control terminal being a gate configured to receive signal PGS. IC layout diagram/device 100A is thereby configured to, in operation, use power switch PS to couple node VVDD and logic gate LG to power supply voltage TVDD responsive to a low logic level of signal PGS in a power on mode, and to decouple node VVDD and logic gate LG from power supply voltage TVDD responsive to a high logic level of signal PGS in a power off mode.

As depicted in FIG. 1B, IC layout diagram/device 100B is a non-limiting example of IC layout diagram/device 100A in which logic gate LG includes inverter INV. IC layout diagram/device 100B is thereby configured to, in operation, couple/decouple node VVDD and inverter INV to/from power supply voltage TVDD responsive to signal PGS.

As depicted in FIG. 1C, IC layout diagram/device 100C includes logic gate LG coupled between power supply voltage TVDD and a node VVSS, and power switch PS including an NMOS transistor coupled between node VVSS and reference voltage TVSS. In some embodiments, node VVSS is also referred to as a voltage VVSS, a virtual reference voltage VVSS, or a virtual reference voltage node VVSS.

Power switch PS of IC layout diagram/device 100C includes the control terminal being a gate configured to receive signal PGS. IC layout diagram/device 100C is thereby configured to, in operation, use power switch PS to couple node VVSS and logic gate LG to reference voltage TVSS responsive to the high logic level of signal PGS in the power on mode, and to decouple node VVSS and logic gate LG from reference voltage TVSS responsive to the low logic level of signal PGS in the power off mode.

By the configurations discussed above, each of IC layout diagrams/devices 100A-100C is capable of being distributed throughout IC circuits as needed to address localized IR drop issues related to electromigration and circuit timing. In some embodiments, an IC floorplan arranged to include one or more of IC layout diagrams/devices 100A-100C is thereby capable of having improved area density compared to approaches in which cells/circuits with equivalent logic are electrically connected to local networks that are electrically connected to power distribution networks through network-level power switches.

In some embodiments, an instance of IC layout diagrams/devices 100A-100C is used to replace an equivalent logic cell/circuit in response to a design check, e.g., detecting a resistance-based voltage drop above a threshold, thereby improving design efficiency by avoiding adding parallel network-level power switches as part of an ECO design stage.

Figure 2:
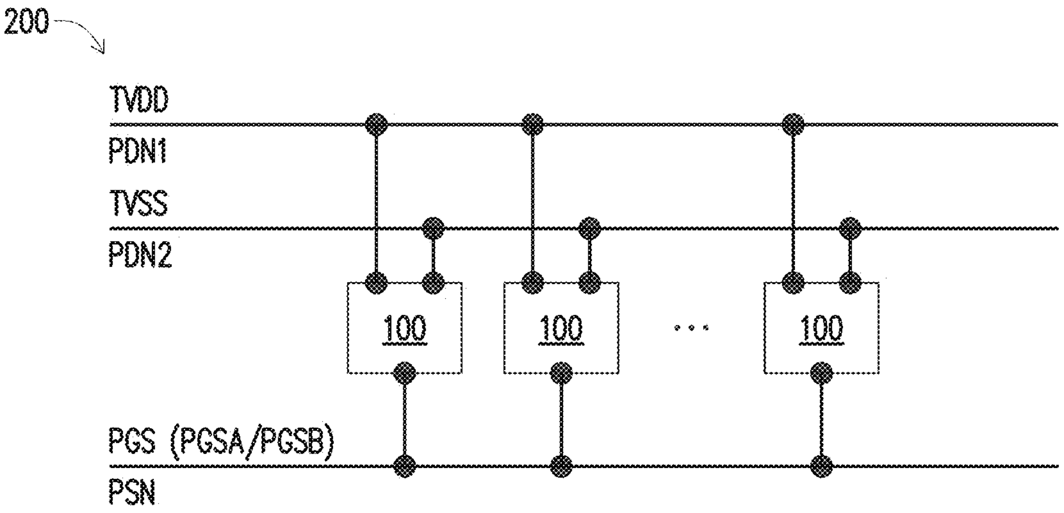
FIG. 2 is a diagram of an IC layout diagram and corresponding IC device, in accordance with some embodiments.

FIG. 2 is a diagram of an IC layout diagram 200 and corresponding IC device 200, in accordance with some embodiments. IC layout diagram/device 200 includes multiple instances of IC layout diagrams/devices 100A-100C (represented as IC layout diagram/device 100), each electrically connected to a power distribution network PDN1 configured to distribute power supply voltage TVDD, a power distribution network PDN2 configured to distribute reference voltage TVSS, and a power signal distribution network PSN configured to distribute power gating signal PGS as a single signal PGS or as complementary signals PGSA and PGSB.

Each of power distribution networks PDN1 and PDN2 and power signal distribution network PSN is an IC layout diagram/structure configured to distribute the corresponding power domain voltage power supply voltage TVDD, reference voltage TVSS, or signal PGS to various IC devices, e.g., logic cells 100A-100C discussed above. In various embodiments, a power distribution network PDN1, power distribution network PDN2, and/or power signal distribution network PSN is referred to as a corresponding power grid PDN1 or PDN2, or a corresponding interconnect structure PDN1, PDN2, and/or PSN.

In some embodiments, in addition to power distribution networks PDN1 and PDN2, IC layout diagram/device 200 includes one or more local distribution networks (not shown) coupled to one or both of power distribution network PDN1 or PDN2 through one or more network power switches, e.g., a power switch PSW discussed below with respect to FIG. 6, configured to receive a power gating signal, e.g., signal PGS. The one or more local distribution networks are thereby configured to distribute a power supply voltage, e.g., voltage VVDD, and/or a reference voltage, e.g., voltage VVSS, responsive to the power gating signal, e.g., to one or more IC devices (not shown) in addition to the instances of IC layout diagram/device 100.

By the configuration discussed above, IC layout diagram/device 200 including the instances of IC layout diagrams/devices 100A-100C is capable of realizing the benefits discussed above with respect to FIGS. 1A-1C.

Figure 3:
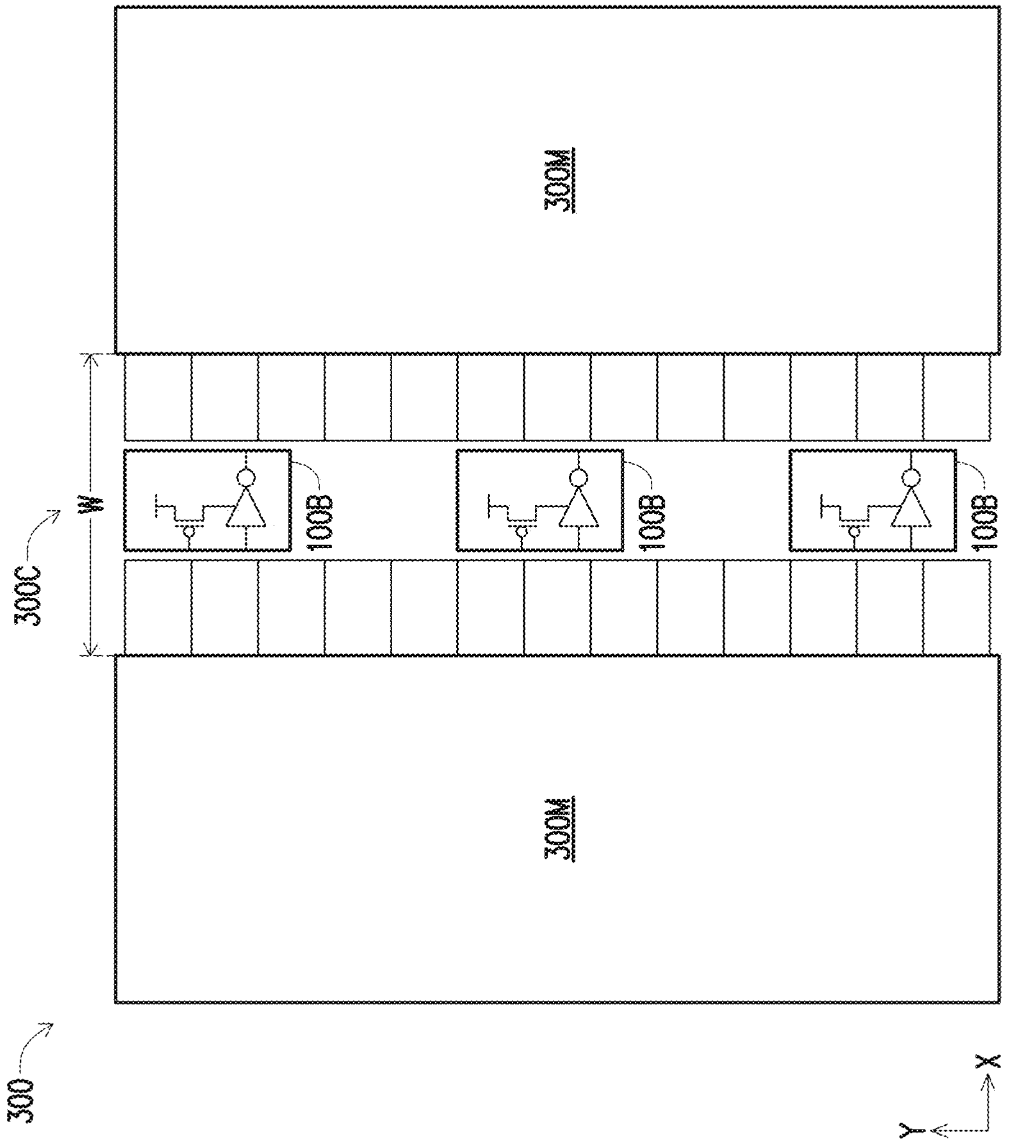
FIG. 3 is a diagram of an IC layout diagram and corresponding IC device, in accordance with some embodiments.

FIG. 3 is a diagram of an IC layout diagram 300 and corresponding IC device 300, in accordance with some embodiments. In addition to IC layout diagram/device 300, FIG. 3 includes X and Y directions. In some embodiments, IC layout diagram 300 is referred to as a floorplan 300.

IC layout diagram/device 300 includes two instances of a memory macro 300M and a memory channel 300C coupled between the instances of memory macro 300M. The numbers of instances of memory macro 300M and memory channel 300C depicted in FIG. 3 are non-limiting examples presented for the purpose of illustration. Numbers of instances of memory macro 300M and memory channel 300C other than those depicted in FIG. 3 are within the scope of the present disclosure.

In various embodiments, the instances of memory macro 300M include static random-access memory (SRAM) devices or other types of memory devices.

Memory channel 300C includes boundary cells (not labeled) of each instance of memory macro 300M electrically connected to each other through instances of IC layout diagram/device 100B discussed above with respect to FIGS. 1A-1C.

Memory channel 300C has a width W in the X direction extending between the instances of memory macro 300M. Width W has a value that is a function of the arrangement of the boundary cells and instances of IC layout diagram/device 100B. In some embodiments, width W has a value ranging from 2 micrometers (μm) to 4 μm. In some embodiments, width W has a value ranging from 1 μm to 2 μm.

By including the instances of IC layout diagram/device 100B, IC layout diagram/device 300 is capable of having width W based on memory channel 300C being free from including a local distribution network or including a limited local distribution network. IC layout diagram/device 300 is thereby capable of having improved area density based on width W being narrower than corresponding widths based on other approaches, e.g., those in which a memory channel includes a local distribution network and network power switches and does not include IC layout diagrams/devices including power switches.

Figure 4:
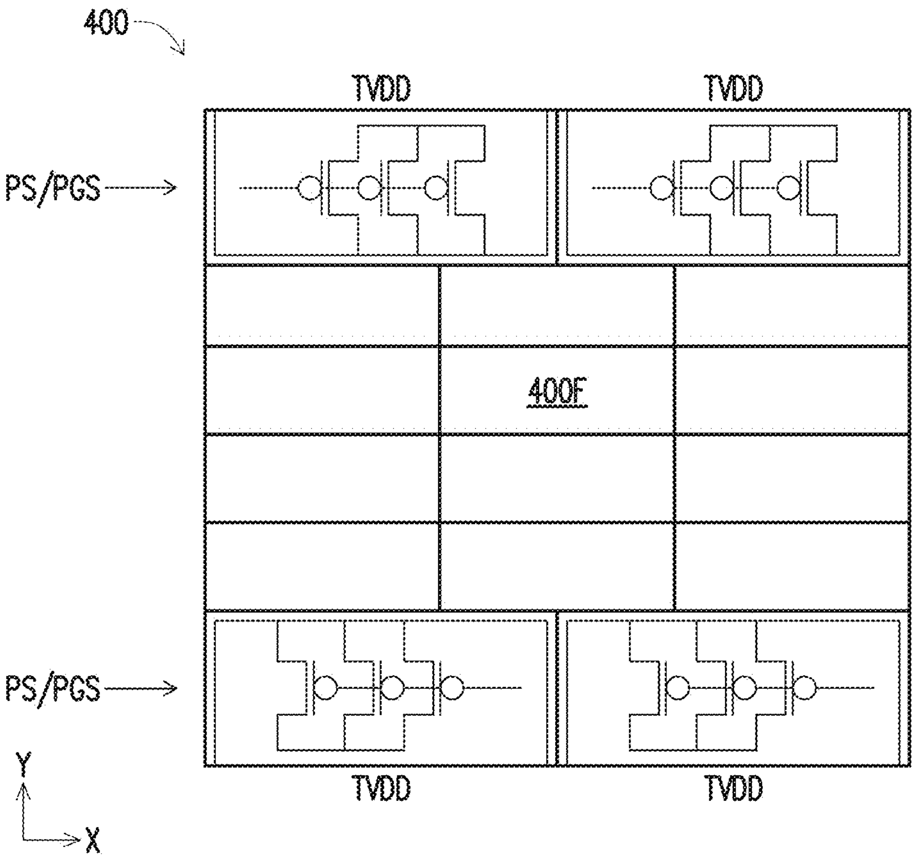
FIG. 4 is a diagram of an IC layout diagram and corresponding IC device, in accordance with some embodiments.

FIG. 4 is a diagram of an IC layout diagram 400 and corresponding IC device 400, in accordance with some embodiments. In addition to IC layout diagram/device 400, FIG. 4 includes the X and Y directions.

IC layout diagram/device 400 corresponds to a multi-bit synchronizer flop circuit cell/device including multiple instances of a single-bit synchronizer flop 400F (a single instance labeled for the purpose of clarity), also referred to as flop 400F in some embodiments. In some embodiments, IC layout diagram 400 is referred to as a cell 400 or a flop cell 400.

Each instance of flop 400F is an IC layout portion corresponding to a logic circuit that includes multiple logic gates configured to synchronize transmission of a data bit to a clock signal (not shown). The instances of flop 400 are thereby collectively configured to synchronize transmission of a plurality of data bits to the clock signal.

IC layout diagram/device 400 includes multiple instances of power switch PS including a PMOS transistor as discussed above, each configured to, in operation, receive signal PGS and in response couple/decouple one or more instances of flop 400F to/from power supply voltage TVDD. The numbers of instances of power switch PS and flop 400F depicted in FIG. 4 are non-limiting examples presented for the purpose of illustration. Numbers of instances of power switch PS and flop 400F other than those depicted in FIG. 4 are within the scope of the present disclosure.

By including the instances of power switch PS, an IC layout diagram/circuit including IC layout diagram/device 400 is capable of including instances of flop 400F while being free from including a local distribution network or including a limited local distribution network. The IC layout diagram/circuit including IC layout diagram/device 400 is thereby capable of having improved area density compared to other approaches, e.g., those in which a circuit includes a plurality of single-bit flops electrically connected to a local distribution network and one or more network power switches, and does not include IC layout diagrams/devices including power switches.

Figure 5:
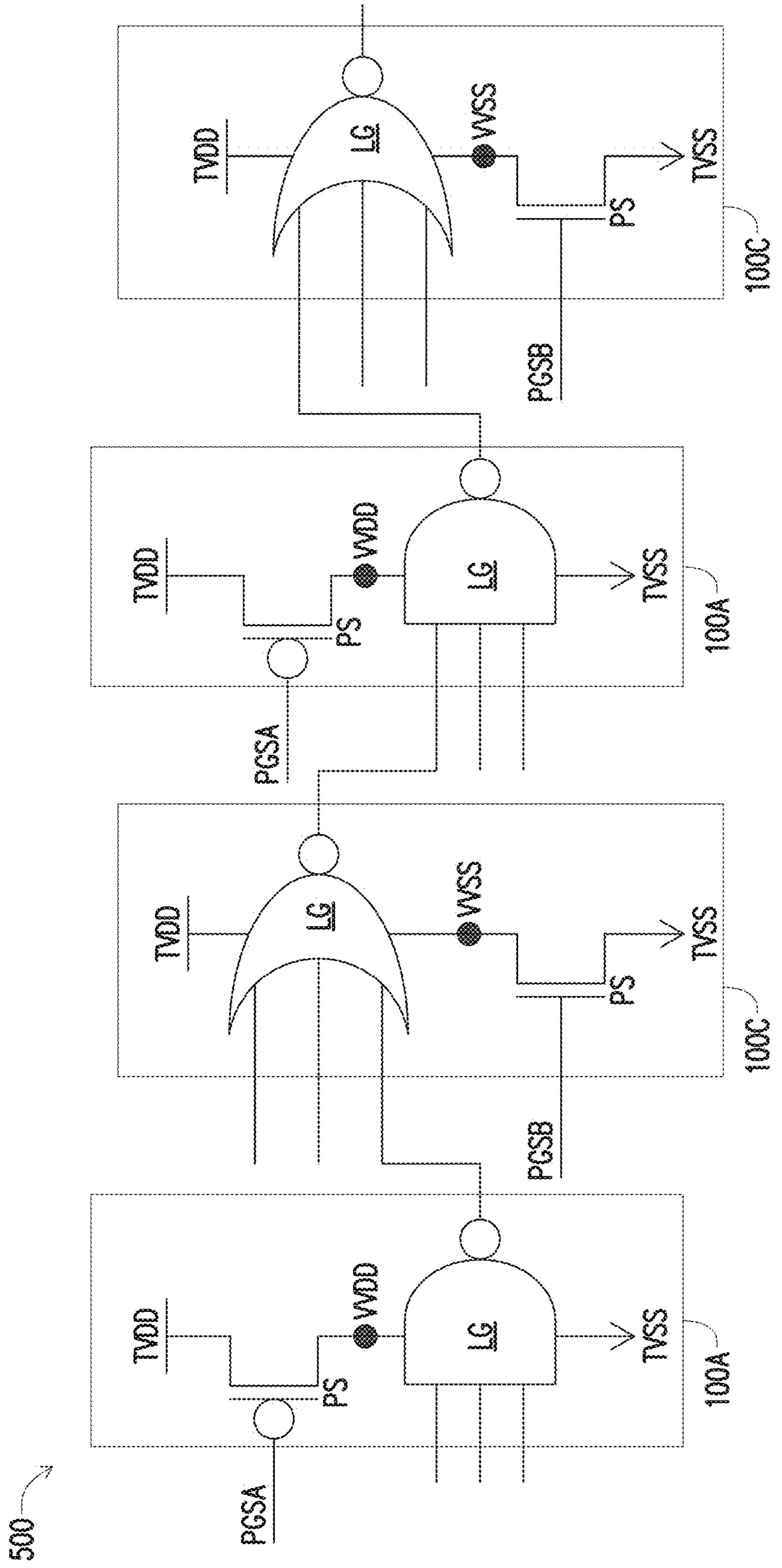
FIG. 5 is a diagram of an IC layout diagram and corresponding IC device, in accordance with some embodiments.

FIG. 5 is a diagram of an IC layout diagram 500 and corresponding IC device 500, in accordance with some embodiments. IC layout diagram/device 500 includes multiple instances of each of IC layout diagrams/devices 100A and 100C, each electrically connected to power supply voltage TVDD and reference voltage TVSS.

In the embodiment depicted in FIG. 5, each instance of IC layout diagram/device 100A includes logic gate LG including a NAND gate, and the control terminal of power switch PS configured to receive power gating signal PGSA. Each instance of IC layout diagram/device 100C includes logic gate LG including a NOR gate, and the control terminal of power switch PS configured to receive power gating signal PGSB complementary to signal PGSA.

In various embodiments, IC layout diagram/device 500 includes power gating signals PGSA and PGSB configured to be received at each corresponding instance of IC layout diagram/device 100A or 100C simultaneously or sequentially.

IC layout diagram/device 500 is thereby configured to include the instances of IC layout diagrams/devices 100A and 100C configured to, in operation, simultaneously or sequentially couple/decouple the corresponding instances of node VVDD and logic gate LG to/from power supply voltage TVDD responsive to signal PGSA and couple/decouple the corresponding instances of node VVSS and logic gate LG to/from reference voltage TVSS responsive to signal PGSB.

The number and arrangement of the instances of IC layout diagrams/devices 100A and 100C and types of logic gates LG depicted in FIG. 5 is a non-limiting example provided for the purpose of illustration. IC layout diagram/device 500 including other numbers and/or arrangements of instances of IC layout diagrams/devices 100A and/or 100C and/or types of logic gates LG whereby instances of logic gate LG are simultaneously or sequentially coupled/decoupled to/from power supply voltage TVDD and reference voltage TVSS are within the scope of the present disclosure.

By the configuration discussed above, IC layout diagram/device 500 including the instances of IC layout diagrams/devices 100A and 100C is capable of realizing the benefits discussed above with respect to FIGS. 1A-1C.

Figure 6:
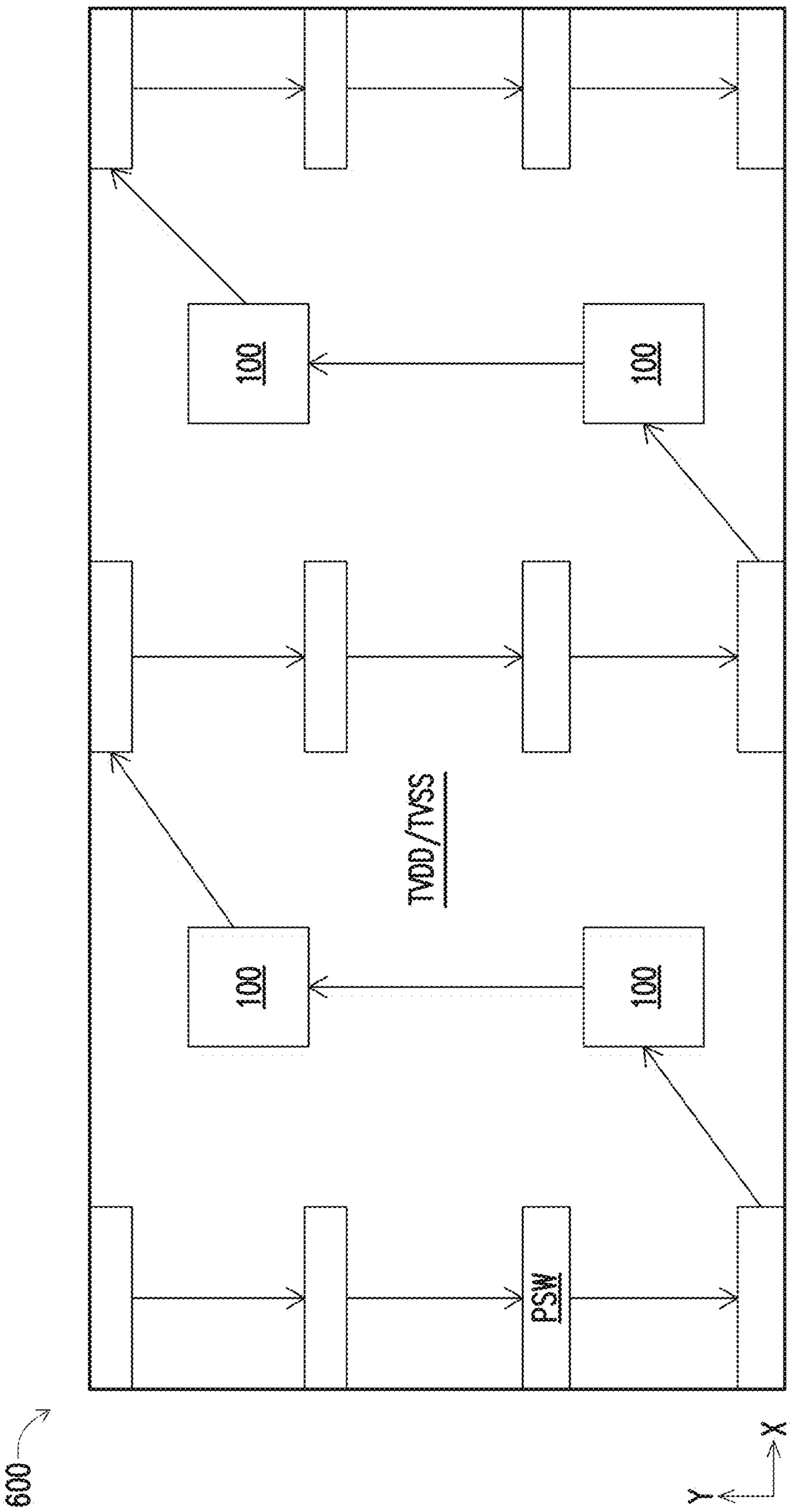
FIG. 6 is a diagram of an IC layout diagram and corresponding IC device, in accordance with some embodiments.

FIG. 6 is a diagram of an IC layout diagram 600 and corresponding IC device 600, in accordance with some embodiments. In addition to IC layout diagram/device 600, FIG. 6 includes the X and Y directions. In some embodiments, IC layout diagram 600 is referred to as a floorplan 600.

IC layout diagram/device 600 corresponds to a power domain including power supply voltage TVDD and reference voltage TVSS. IC layout diagram/device 600 includes multiple instances of network power switch PSW (a single instance labeled for the purpose of clarity) and multiple instances of IC layout diagrams/devices 100A-100C (represented as IC layout diagram/device 100), each electrically connected to power distribution networks (not shown) configured to distribute power supply voltage TVDD and reference voltage TVSS and configured to receive one or more power gating signals, e.g., signal PGS discussed above.

Each instance of network power switch PSW is coupled between one of the power distribution networks and one or more local distribution networks (not shown) and is configured to receive the one or more power gating signals. IC layout diagram/device 600 includes multiple instances of logic cells/device (not shown) electrically connected to the one or more local distribution networks.

IC layout diagram/device 600 includes the instances of network power switch PSW and IC layout diagram/device 100 configured in a daisy chain arrangement whereby a power up operation is performed in the sequence indicated by the arrows, e.g., by including one or more delay elements configured to propagate the one or more power gating signals in accordance with the arrows.

In some embodiments, the instances of IC layout diagram 100 are classified as isolation cells to enable them to be included in low power checks of an IC layout design method, e.g., method 700 or 800 discussed below with respect to FIGS. 7 and 8.

By the configuration discussed above, IC layout diagram/device 600 including the instances of IC layout diagram/device 100 is capable of realizing the benefits discussed above with respect to FIGS. 1A-1C.

FIG. 7 is a flowchart of method 700 of generating an IC layout diagram, in accordance with some embodiments. In some embodiments, generating the IC layout diagram includes generating some or all of one or more of IC layout diagrams 100A-600 discussed above with respect to FIGS. 1A-6.

In some embodiments, some or all of method 700 is executed by a processor of a computer. In some embodiments, some or all of method 700 is executed by a processor 902 of IC layout diagram generation system 900, discussed below with respect to FIG. 9.

In some embodiments, one or more operations of method 700 are a subset of operations of a method of forming an IC device. In some embodiments, one or more operations of method 700 are a subset of operations of an IC manufacturing flow, e.g., the IC manufacturing flow discussed below with respect to manufacturing system 1000 and FIG. 10.

In some embodiments, the operations of method 700 are performed in the order depicted in FIG. 7. In some embodiments, the operations of method 700 are performed simultaneously and/or in an order other than the order depicted in FIG. 7. In some embodiments, one or more operations are performed before, between, during, and/or after performing one or more operations of method 700.

At operation 702A, in some embodiments, a floorplan of an IC device, also referred to as an IC layout diagram in some embodiments, is accessed, e.g., retrieved from a storage device. The floorplan includes two SRAM macros adjacent to an SRAM channel including a local distribution network coupled to a first power distribution network through one or more network power switches.

At operation 702B, in some embodiments, the local distribution network, e.g., configured to distribute voltage VVDD, and the one or more network power switches, e.g., power switches PSW, are removed from the SRAM channel.

At operation 702C, in some embodiments, a special voltage area is created in the SRAM channel by placing a plurality of logic circuits in the SRAM channel, each of the logic circuits including a series arrangement of logic gate and a power switch electrically connected to the first power distribution network and a second power distribution network, the first and second power distribution networks being configured to distribute power supply and reference voltages, e.g., voltages TVDD and TVSS discussed above.

In some embodiments, creating the special voltage area includes creating memory channel 300C including instances of IC layout diagram/device 100B discussed above with respect to FIG. 3.

At operation 704, a cell placement operation is performed. In some embodiments, performing the cell placement operation includes placing one or more instances of IC layout diagram/device 100A-100C discussed above with respect to FIGS. 1A-1C.

At operation 706, in some embodiments, a clock signal path routing operation is performed. Performing a routing operation includes configuring a plurality of conductive regions/segments in the IC layout diagram/device whereby electrical connections to the various cells are established.

At operation 708, in some embodiments, a power supply and signal path routing operation is performed.

At operation 710A, in some embodiments, a signoff operation is performed. Performing the signoff operation includes verifying that the IC layout design conforms to a plurality of predetermined design criteria, e.g., one or more electromigration, resistance-based voltage drop, and/or timing criteria.

In some embodiments, operation 710A includes performing one or more iterations of the signoff operation after each performance of one or more executions of operations 710B-710D discussed below.

In some embodiments, operation 710A includes storing the IC layout diagram in a storage device, e.g., after verifying that the IC layout design conforms to the plurality of predetermined design criteria, for example after one or more iterations of operations 710B-710D have been performed.

In some embodiments, storing the IC layout diagram in the storage device includes storing the IC layout diagram in an IC layout diagram library, e.g., layout diagram library 909 of IC layout diagram generation system 900, discussed below with respect to FIG. 9

At operation 710B, in some embodiments, one or more instances of non-conformity with the predetermined design criteria are identified, e.g., by determining that a voltage level from a circuit simulation meets or exceeds a predetermined threshold level. Identifying the one or more instances includes identifying one or more locations in the IC layout diagram corresponding to the instances.

At operation 710C, in some embodiments, one or more cells including power switches are used to replace one or more cells at the one or more locations identified in operation 700B. Using the one or more replacement cells includes establishing electrical connections between the first and second power distribution networks and the one or more replacement cells.

In some embodiments, using the one or more replacement cells includes using one or more of IC layout diagrams 100A-100C discussed above with respect to FIGS. 1A-1C.

At operation 710D, in some embodiments, a daisy chain configuration is configured, or an existing daisy chain is reconfigured, to include the one or more replacement cells, e.g., as discussed above with respect to FIG. 6.

By executing some or all of the operations of method 700, an IC layout diagram is generated in which one or more instances of a cell include a power switch arranged in series with a logic gate, and is thereby capable of realizing the benefits discussed above with respect to IC layout diagrams/structures 100 and 200.

FIGS. 8A and 8B are flowcharts of methods 800A and 800B of generating an IC layout diagram, in accordance with some embodiments. Method 800A includes operations 802-812, in some embodiments, and method 800B includes operations 804, 806, 810, and 812 in some embodiments, a subset of the operations of method 800A.

In some embodiments, generating the IC layout diagram includes generating some or all of one or more of IC layout diagrams 100A-600 discussed above with respect to FIGS. 1A-6.

In some embodiments, some or all of method 800A and/or 800B is executed by a processor of a computer. In some embodiments, some or all of method 800A and/or 800B is executed by processor 902 of IC layout diagram generation system 900, discussed below with respect to FIG. 9.

In some embodiments, one or more operations of method 800A and/or 800B are a subset of operations of a method of forming an IC device. In some embodiments, one or more operations of method 800A and/or 800B are a subset of operations of an IC manufacturing flow, e.g., the IC manufacturing flow discussed below with respect to manufacturing system 1000 and FIG. 10.

In some embodiments, the operations of method 800A and/or 800B are performed in the order depicted in FIGS. 8A and 8B. In some embodiments, the operations of method 800A and/or 800B are performed simultaneously and/or in an order other than the order depicted in FIGS. 8A and 8B. In some embodiments, one or more operations are performed before, between, during, and/or after performing one or more operations of method 800A and/or 800B.

At operation 802, in some embodiments of method 800A, a first logic cell is modified by adding a first power switch in series with a first logic gate, the first power switch including a first control terminal. Modifying the first logic cell includes storing the modified first logic cell in a storage device, e.g., cell library 907 of IC layout diagram generation system 900, discussed below with respect to FIG. 9.

In some embodiments, modifying the first logic cell includes generating one of IC layout diagrams 100A-100C discussed above with respect to FIGS. 1A-1C.

At operation 804, in some embodiments, a plurality of logic cells is placed in the IC layout diagram, each logic cell of the plurality of logic cells including a series arrangement of a power switch and a logic gate. In some embodiments, placing the plurality of logic cells in the IC layout diagram includes placing one or more of IC layout diagrams 100A-100C discussed above with respect to FIGS. 1A-1C and/or one or more of IC layout diagram 400 discussed above with respect to FIG. 4.

In some embodiments, placing the plurality of logic cells in the IC layout diagram includes placing the plurality of logic cells in one of IC layout diagrams 200, 300, 500, or 600 discussed above with respect to FIGS. 2, 3, 5, and 6.

In some embodiments, placing the plurality of logic cells in the IC layout diagram includes executing one or more of operations 720A-704 discussed above with respect to FIG. 7.

In some embodiments, placing the plurality of logic cells in the IC layout diagram includes retrieving the plurality of logic cells from a storage device, e.g., cell library 907 of IC layout diagram generation system 900, discussed below with respect to FIG. 9. In some embodiments, retrieving the plurality of logic cells from the storage device includes retrieving the logic cell modified in operation 802 of method 800A.

At operation 806, in some embodiments, electrical connections to the logic cells of the plurality of logic cells are established. The logic cells include a series arrangement of a power switch and a logic gate, and establishing the electrical connections includes establishing first electrical connections between a first power distribution network and first ends of the series arrangements of each logic cell of the plurality of logic cells, establishing second electrical connections between a second power distribution network and second ends of the series arrangements of each logic cell of the plurality of logic cells, and establishing third electrical connections between a power gating signal network and control terminals of the power switches of each logic cell of the plurality of logic cells.

In some embodiments, establishing the electrical connections includes establishing electrical connections between power distribution networks PDN1 and PDN2 and power signal gating network PSN to instances of IC layout diagrams 100 as discussed above with respect to FIG. 2.

At operation 808, in some embodiments of method 800A, a determination is made that a resistance-based voltage drop corresponding to a previously placed logic cell of the IC layout diagram exceeds a predetermined limit, and a logic cell including a series power switch, e.g., one of IC layout diagrams 100A-100C or 400 discussed above with respect to FIGS. 1A-1C and 4, is used to replace the previously placed logic cell in response to the determination.

In some embodiments, replacing the previously placed logic cell in the IC layout diagram includes executing one or more of operations 710A-710D discussed above with respect to FIG. 7.

In some embodiments, using the logic cell including the series power switch to replace the previously placed logic cell includes establishing electrical connections to the logic cell including the series power switch, e.g., by executing operation 806 discussed above. In some embodiments, replacing the previously placed logic cell includes removing a previously established electrical connection between the previously placed logic cell and a local power distribution network coupled to a power distribution network through a network power switch.

At operation 810, in some embodiments, the IC layout diagram is stored in a storage device. In some embodiments, storing the IC layout diagram in the storage device includes storing the IC layout diagram in an IC layout diagram library, e.g., layout diagram library 909 of IC layout diagram generation system 900, discussed below with respect to FIG. 9.

In some embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 914 of IC layout diagram generation system 900, discussed below with respect to FIG. 9.

At operation 812, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 10.

By executing some or all of the operations of method 800A and/or 800B, an IC layout diagram is generated in which in which one or more instances of a cell include a power switch arranged in series with a logic gate, and is thereby capable of realizing the benefits discussed above with respect to IC layout diagrams/structures 100 and 200.

FIG. 9 is a block diagram of an electronic design automation (EDA) system 900 in accordance with some embodiments. EDA system 900 is usable to execute some or all of methods 700 and/or 800 discussed above.

In some embodiments, EDA system 900 includes an automatic placement and routing (APR) system. Methods described herein of designing layout diagrams including wire routing, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores cell library 907 of IC layout cells including such cells as disclosed herein. In one or more embodiments, storage medium 904 stores one or more layout diagrams 909 corresponding to one or more layouts disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a user interface (UI) through I/O interface 910. The information is stored in computer-readable medium 904 as UI 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
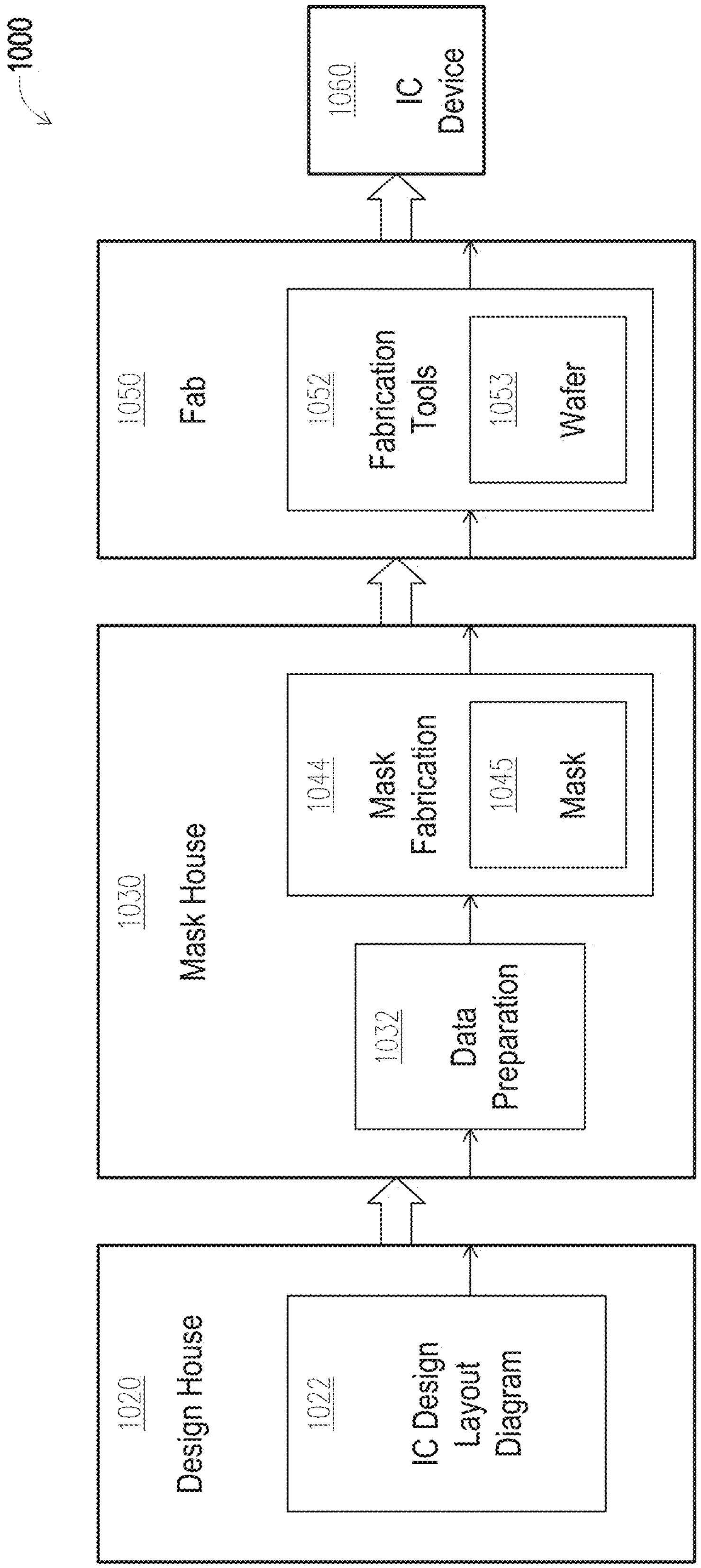
FIG. 10 is a block diagram of an integrated circuit (IC) manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator (fab) 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022, e.g., including one or more of IC layout diagrams 100A-600 discussed above with respect to FIGS. 1A-6. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file (RDF). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for photolithographic implementation effects during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

In some embodiments, an IC device includes a first interconnect structure configured to distribute a power supply voltage, a second interconnect structure configured to distribute a reference voltage, a third interconnect structure configured to distribute a first power gating signal, and a plurality of logic circuits. Each logic circuit of the plurality of logic circuits includes a power switch coupled in series with a logic gate between the first and second interconnect structures, and the power switch includes a control terminal coupled to the third interconnect structure. In some embodiments, the logic gate of each logic circuit of the plurality of logic circuits comprises one or more of an inverter, a buffer, a transmission gate, an AND gate, a NAND gate, an OR gate, a NOR gate, or an XOR gate. In some embodiments, the power switch of a first logic circuit of the plurality of logic circuits includes a PMOS transistor coupled between the logic gate and the first interconnect structure, wherein the control terminal includes a gate of the PMOS transistor. In some embodiments, the power switch of a first logic circuit of the plurality of logic circuits includes an NMOS transistor coupled between the logic gate and the second interconnect structure, wherein the control terminal includes a gate of the NMOS transistor. In some embodiments, the plurality of logic circuits includes a memory channel coupled between first and second memory macros, and the logic gate of each logic circuit of the plurality of logic circuits includes an inverter. In some embodiments, a first logic circuit of the plurality of logic circuits includes a multi-bit synchronizer flop circuit including a plurality of single-bit synchronizer flops, wherein the power switch is a first power switch of a plurality of power switches of the multi-bit synchronizer flop circuit, the logic gate is a first logic gate of a plurality of logic gates of the multi-bit synchronizer flop circuit, each power switch of the plurality of power switches is coupled in series with a corresponding logic gate of the plurality of logic gates between the first and second interconnect structures, and each single-bit synchronizer flop includes a corresponding logic gate of the plurality of logic gates. In some embodiments, the third interconnect structure is further configured to distribute a second power gating signal complementary to the first power gating signal, a first logic circuit of the plurality of logic circuits includes the power switch including a PMOS transistor coupled between the logic gate and the first interconnect structure and the control terminal including a gate of the PMOS transistor configured to receive the first power gating signal, and a second logic circuit of the plurality of logic circuits includes the power switch including an NMOS transistor coupled between the logic gate and the second interconnect structure and the control terminal including a gate of the NMOS transistor configured to receive the second power gating signal.

In some embodiments, a method of generating an IC layout diagram includes placing a plurality of logic cells in the IC layout diagram, wherein each logic cell of the plurality of logic cells includes a series arrangement of a power switch and a logic gate, establishing first electrical connections between a first power distribution network and first ends of the series arrangement of each logic cell of the plurality of logic cells, establishing second electrical connections between a second power distribution network and second ends of the series arrangements of each logic cell of the plurality of logic cells, establishing third electrical connections between a power gating signal network and control terminals of the power switch of each logic cell of the plurality of logic cells, and storing the IC layout diagram including the plurality of logic cells in a storage device. In some embodiments, the method includes modifying a first logic cell by adding a first power switch in series with a first logic gate, the first power switch including a first control terminal, storing the modified first logic cell in a first storage device, the first storage device being the storage device or another storage device, and receiving the modified first logic cell from the first storage device, wherein the modified first logic cell is a logic cell of the plurality of logic cells, and the series arrangement of the power switch and the logic gate of the logic cell of the plurality of logic cells includes the first power switch in series with the first logic gate. In some embodiments, the method includes making a determination that a resistance-based voltage drop corresponding to a previously placed logic cell of the IC layout diagram exceeds a predetermined limit, wherein placing the plurality of logic cells in the IC layout diagram includes using a logic cell of the plurality of logic cells to replace the previously placed logic cell in response to the determination. In some embodiments, establishing the first electrical connection between the first power distribution network and the first end of the series arrangement of the logic cell of the plurality of logic cells includes removing a previously established electrical connection between the previously placed logic cell and a third power distribution network coupled to the first power distribution network through a network power switch. In some embodiments, the IC layout diagram includes a plurality of memory macros, placing the plurality of logic cells in the IC layout diagram includes placing the plurality of logic cells between first and second memory macros of the plurality of memory macros, and the logic gate of each logic cell of the plurality of logic cells includes an inverter configured to couple a corresponding first boundary cell of the first memory macro to a corresponding second boundary cell of the second memory macro. In some embodiments, a first logic cell of the plurality of logic cells includes a multi-bit synchronizer flop circuit including a plurality of single-bit synchronizer flops, wherein the series arrangement is a first series arrangement of a plurality of series arrangements of a corresponding plurality of power switches and a corresponding plurality of logic gates of the multi-bit synchronizer flop circuit, each single-bit synchronizer flop includes a corresponding logic gate of the plurality of logic gates, establishing the first electrical connections includes establishing first electrical connections between the first power distribution network and first ends of each series arrangement of the plurality of series arrangements, establishing the second electrical connections includes establishing second electrical connections between the second power distribution network and second ends of each series arrangement of the plurality of series arrangements, and establishing the third electrical connections includes establishing third electrical connections between the power gating signal network and control terminals of each power switch of each series arrangement of the plurality of series arrangements. In some embodiments, the first power distribution network is configured to distribute a power supply voltage, the second power distribution network is configured to distribute a reference voltage, establishing the first electrical connection between the first power distribution network and the first end of the series arrangement of a first logic cell of the plurality of logic cells includes establishing the first electrical connection to the power switch including a PMOS transistor, and establishing the third electrical connection between the power gating signal network and the control terminal of the power switch of the first logic cell of the plurality of logic cells includes establishing the third electrical connection to a gate of the PMOS transistor. In some embodiments, establishing the second electrical connection between the second power distribution network and the second end of the series arrangement of a second logic cell of the plurality of logic cells includes establishing the second electrical connection to the power switch including an NMOS transistor, and establishing the third electrical connection between the power gating signal network and the control terminal of the power switch of the second logic cell of the plurality of logic cells includes establishing the third electrical connection to a gate of the NMOS transistor.

In some embodiments, an EDA system includes a processor and a non-transitory, computer readable storage medium including computer program code for one or more programs, the non-transitory, computer readable storage medium and the computer program code being configured to, with the processor, cause the processor to place first and second logic cells in an IC layout diagram, the second logic cell including a series arrangement of a power switch and a logic gate, route first and second electrical connections of respective first and second power distribution networks to the first logic cell, wherein the first power distribution network is coupled to a third power distribution network through a network power switch and the third power distribution network is configured to distribute one of a power supply voltage or a reference voltage, route third and fourth electrical connections of the respective second and third power distribution networks to the second logic cell, and store the IC layout diagram including the plurality of logic cells in a storage device. In some embodiments, the non-transitory, computer readable storage medium and the computer program code are configured to, with the processor, further cause the processor to place the second logic cell by replacing a third logic cell with the second logic cell classified as an isolation cell. In some embodiments, the non-transitory, computer readable storage medium and the computer program code are configured to, with the processor, further cause the processor to, prior to routing the first and second electrical connections to the first logic cell, place a plurality of second logic cells in the IC layout diagram, wherein each second logic cell of the plurality of second logic cells includes a series arrangement of a power switch and a logic gate, and route pluralities of fifth and sixth electrical connections of the respective second and third power distribution networks to the plurality of second logic cells. In some embodiments, the non-transitory, computer readable storage medium and the computer program code are configured to, with the processor, further cause the processor to route the third and fourth electrical connections by including the network power switch and the second logic cell in a daisy chain arrangement. In some embodiments, the non-transitory, computer readable storage medium and the computer program code are configured to, with the processor, further cause the processor to route fifth electrical connections of a power gating signal network to a control terminal of the power switch of the second logic cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device comprising:
- a first interconnect structure configured to distribute a power supply voltage;
- a second interconnect structure configured to distribute a reference voltage;
- a third interconnect structure configured to distribute a first power gating signal;
- a plurality of network power switches; and
- a plurality of logic circuits, wherein
  - each logic circuit of the plurality of logic circuits comprises:
    - a power switch coupled in series with a logic gate between the first and second interconnect structures,
  - wherein the power switch comprises a control terminal coupled to the third interconnect structure, a first logic circuit of the plurality of logic circuits comprises the logic gate directly connected to the first interconnect structure, and the plurality of network power switches and the plurality of logic circuits are configured in a daisy chain arrangement.

2. The IC device of claim 1, wherein the logic gate of each logic circuit of the plurality of logic circuits comprises one or more of an inverter, a buffer, a transmission gate, an AND gate, a NAND gate, an OR gate, a NOR gate, or an XOR gate.

3. The IC device of claim 1, wherein the power switch of a second logic circuit of the plurality of logic circuits comprises:

a PMOS transistor coupled between the logic gate and the first interconnect structure, wherein the control terminal comprises a gate of the PMOS transistor.

4. The IC device of claim 1, wherein the power switch of the first logic circuit of the plurality of logic circuits further comprises:

an NMOS transistor coupled between the logic gate and the second interconnect structure, wherein the control terminal comprises a gate of the NMOS transistor.

5. The IC device of claim 1, wherein the third interconnect structure is further configured to distribute a second power gating signal complementary to the first power gating signal, a second logic circuit of the plurality of logic circuits comprises:

the power switch comprising a PMOS transistor coupled between the logic gate and the first interconnect structure; and the control terminal comprising a gate of the PMOS transistor configured to receive the first power gating signal, and the first logic circuit of the plurality of logic circuits further comprises:

the power switch comprising an NMOS transistor coupled between the logic gate and the second interconnect structure; and the control terminal comprising a gate of the NMOS transistor configured to receive the second power gating signal.

6. The IC device of claim 1, wherein the plurality of logic circuits comprises the logic circuits arranged in series.

7. The IC device of claim 1, wherein the first power gating signal is configured to cause the power switch of the first logic circuit of the plurality of logic circuits to couple or decouple the logic gate from the second interconnect structure in accordance with respective power on and power off modes of a power domain of the power supply voltage.

8. An integrated circuit (IC) device comprising:

a first interconnect structure configured to distribute a power supply voltage;

a second interconnect structure configured to distribute a reference voltage;

a third interconnect structure configured to distribute a power gating signal;

a plurality of network power switches; and a plurality of logic circuits, wherein each logic circuit of the plurality of logic circuits comprises:

a series arrangement of a transistor and a logic gate comprising a first end electrically connected to the first interconnect structure and a second end electrically connected to the second interconnect structure, wherein the transistor comprises a gate electrically connected to the third interconnect structure, at least one first logic circuit of the plurality of logic circuits comprises the logic gate directly connected to the first interconnect structure, and the plurality of network power switches and the plurality of logic circuits are configured in a daisy chain arrangement.

9. The IC device of claim 8, wherein the third interconnect structure is configured to distribute the power gating signal as a complementary signal pair, at least one second logic circuit of the plurality of logic circuits comprises the transistor being a PMOS transistor configured to receive one of the complementary signal pair, and the at least one first logic circuit of the plurality of logic circuits comprises the transistor being an NMOS transistor configured to receive the other of the complementary signal pair.

10. The IC device of claim 9, wherein the at least one second logic circuit of the plurality of logic circuits comprises the logic gate comprising a NAND gate, and the at least one first logic circuit of the plurality of logic circuits comprises the logic gate comprising a NOR gate.

11. The IC device of claim 8, wherein the logic circuits of the plurality of logic circuits are arranged in series.

12. The IC device of claim 8, wherein the logic gate of each logic circuit of the plurality of logic circuits comprises at least one of an inverter, a buffer, a transmission gate, an AND gate, a NAND gate, an OR gate, a NOR gate, or an XOR gate.

13. The IC device of claim 8, wherein the power gating signal is configured to cause the transistor of the first logic circuit of the plurality of logic circuits to couple or decouple the logic gate from the second interconnect structure in accordance with respective power on and power off modes of a power domain of the power supply voltage.

14. An integrated circuit (IC) device comprising:

a first interconnect structure configured to distribute a power supply voltage;

a second interconnect structure configured to distribute a reference voltage;

a third interconnect structure configured to distribute a power gating signal; and a series arrangement of logic circuits, wherein each logic circuit of the series arrangement of logic circuits comprises:

a power switch coupled in series with a logic gate between the first and second interconnect structures, wherein the power switch comprises a control terminal coupled to the third interconnect structure, each logic circuit of a first subset of logic circuits of the series arrangement of logic circuits comprises a NOR logic gate directly connected to the first interconnect structure, each logic circuit of a second subset of logic circuits of the series arrangement of logic circuits comprises a NAND logic gate directly connected to the second interconnect structure, and the series arrangement of logic circuits comprises the first subset of logic circuits alternating with the second subset circuits.

15. The IC device of claim 14, wherein the power switch of each logic circuit of the first subset of logic circuits of the series arrangement of logic circuits comprises an NMOS transistor, and the power switch of each logic circuit of the second subset of logic circuits of the series arrangement of logic circuits comprises a PMOS transistor.

16. The IC device of claim 15, wherein the NMOS transistor is coupled between the NOR logic gate and the second interconnect structure.

17. The IC device of claim 15, wherein the PMOS transistor is coupled between the NAND logic gate and the first interconnect structure.

18. The IC device of claim 14, wherein the third interconnect structure is configured to distribute the power gating signal as a complementary signal pair.

19. The IC device of claim 18, wherein at least one first logic circuit of the first subset of logic circuits of the series arrangement of logic circuits comprises an NMOS transistor configured to receive one of the complementary signal pair.

20. The IC device of claim 19, wherein at least one second logic circuit of the second subset of logic circuits of the series arrangement of logic circuits comprises a PMOS transistor configured to receive the other of the complementary signal pair.

* * * * *